United States Patent [19]
Lee

[11] Patent Number: 6,029,266
[45] Date of Patent: Feb. 22, 2000

[54] ERROR CORRECTING APPARATUS AND METHOD OF DIGITAL PROCESSING SYSTEM FOR CORRECTING GENERAL AND ERASURE ERRORS

[75] Inventor: Yoon-Woo Lee, Suwon, Rep. of Korea

[73] Assignee: Samsung Electronics Co., Ltd., Suwon, Rep. of Korea

[21] Appl. No.: 08/906,933

[22] Filed: Aug. 6, 1997

[30] Foreign Application Priority Data

Aug. 6, 1996 [KR] Rep. of Korea ...................... 96 32761

[51] Int. Cl.[7] .................................................. H03M 13/00
[52] U.S. Cl. .......................... 714/761; 714/755; 714/758; 714/784
[58] Field of Search .................................... 714/781, 752, 714/746, 769, 755, 771, 756, 762, 758, 761, 784

[56] References Cited

U.S. PATENT DOCUMENTS

| | | | |
|---|---|---|---|
| 4,593,395 | 6/1986 | Immink et al. | 371/37.4 |
| 5,173,925 | 12/1992 | Mizoguchi | 375/232 |
| 5,247,523 | 9/1993 | Arai et al. | 371/37.4 |
| 5,276,561 | 1/1994 | Fukami | 360/32 |
| 5,289,524 | 2/1994 | Takano et al. | 455/31.2 |
| 5,408,478 | 4/1995 | Ohmori et al. | 371/37.5 |
| 5,719,884 | 2/1998 | Roth et al. | 371/37.4 |
| 5,745,505 | 4/1998 | Yonemitsu et al. | 371/37.4 |
| 5,757,824 | 5/1998 | Arai et al. | 371/37.4 |
| 5,778,010 | 7/1998 | Hatta | 371/37.02 |
| 5,781,565 | 7/1998 | Sako et al. | 371/37.4 |
| 5,812,603 | 9/1998 | Luthi et al. | 375/287 |
| 5,835,509 | 11/1998 | Sako et al. | 371/37.4 |

OTHER PUBLICATIONS

Liang, Chien–Chan, Improvement of Performance in Digital Recording with Distanced Modulation Code, IEEE Transactions on Consumer Electronics, vol. 39, No. 4, Nov. 1993.

Bossert, Martin: Kanalcodierung, B.G. Teubner, Stuttgart 1992, S. 137–140, 175–177, 214, 215.

Patel, Arvind M.: Error Recovery Scheme for the IBM 3850 Mass Storage System. In: IBM J. Res. Development, vol. 24, No. 1, Jan. 1980, S. 32–S. 42.

*Primary Examiner*—Albert De Cady
*Assistant Examiner*—Jason Greene
*Attorney, Agent, or Firm*—Staas & Halsey LLP

[57] ABSTRACT

An error correcting apparatus and method of a digital processing system. The error correcting apparatus of the digital processing system includes a demodulator for demodulating channel data to source data and generating an error flag when an error occurs during demodulation, a synchronous detector for receiving the error flag and demodulation data generated from the demodulator and detecting a synchronizing signal to distinguish data by a unit of code which can correct an error, a first decoder for decoding the demodulation data and the error flag by a unit of row by the synchronizing signal to correct an error and an erasure, and a second decoder for decoding the demodulation data and the error flag by a unit of column by the synchronizing signal to correct an error and an erasure.

23 Claims, 6 Drawing Sheets

ERROR CORRECTING APPARATUS AND METHOD OF DIGITAL PROCESSING SYSTEM FOR CORRECTING GENERAL AND ERASURE ERRORS

BACKGROUND OF THE INVENTION

1. Field of the Invention

The present invention relates to an error correcting apparatus and method of a digital processing system, and more particularly, to an apparatus and method which can simultaneously correct both an erasure error and a general error.

2. Description of the Related Art

In a digital data transmitting system, data to be transmitted is modulated and coded. In a digital data receiving system, data to be received is demodulated and decoded. A digital data recording/reproducing system modulates and codes data so as to be recorded in a recording medium, and demodulates and decodes the modulated and coded data so as to reproduce the recorded data. Hereinafter, the digital recording/reproducing system will be explained as an example of a digital processing system.

When reproducing the recorded data in the digital recording/reproducing system, an error data which may be generated during a decoding process should be corrected to accurately reproduce the data. FIG. 1 is a block diagram illustrating a signal processing flow for reproducing the recorded data in the digital recording/reproducing system.

Referring to FIG. 1, a head 111 designates a recording/reproducing head of a channel A, and a head 131 indicates a recording/reproducing head of a channel B. Elements 111–122 for reproducing the recorded data by accessing data of the channel A have the same form as elements 131–142, respectively, for reproducing the recorded data by accessing data of the channel B. For convenience, a description will be given on the basis of a path reproducing the recorded data through the channel A only. The head 111 of the channel A reads data from the recording medium. An amplifier 112 amplifies a signal read from the head 111. A PLL (Phase Lock Loop) 113 reproduces a clock from the amplified signal and supplies the reproduced clock to a demodulator 114 together with data. The demodulator 114 converts received serial data into parallel data and demodulates data modulated when recorded to 8-bit original data. A synchronous detector 116 detects a synchronizing signal from successive data streams of the parallel data. A C2 decoder 117 and a C1 decoder 118, which form part of an error correcting unit, correct error data of received data according to the detected synchronizing signal generated from the synchronous detector 116. There are two kinds of error data, namely, firstly, an erasure error of which error position can be determined by its associated error flag, and secondly, a general error without any flag provided, thereby being incapable of determining its error position. The operation of the C2 decoder 117 and the C1 decoder 118 will be described later on with reference to FIG. 2. A CRC (Cyclic Redundancy Code) part 119 confirms whether the error data is normally corrected through the C2 decoder 117 and the C1 decoder 118. A TBC (Time Base Correction) part 120 eliminates a jitter contained in data generated from the CRC part 119. A deshuffling part 121 re-arranges data generated from the TBC part 120 to an original data format. A concealment part 122 converts data which does not correct error data from the re-arranged data into a value similar to original data so as not to be noticed by human beings. A multiplexer 151 multiplexes data generated from the concealment part 122 of the channel A and a concealment part 142 of the channel B. A digital-to-analog (D/A) converter 152 converts the multiplexed data into an analog signal. A low pass filter (LPF) 153 low pass filters the analog signal to a voice signal band.

FIG. 2 illustrates a conventional error correcting apparatus for implementing an error correcting function in FIG. 1. The error correcting function is performed by the elements 114–118 of the channel A and elements 134–138 of the channel B. The demodulator 114 receives the serial data reproduced from the head 111 of the channel A, converts the serial data into the 8-bit parallel data, and demodulates the data modulated when recorded to the original data. The demodulator 114 is constructed as shown in FIG. 3. It is assumed that a modulation code of data recorded in the recording medium uses an eight-to-sixteen modulation plus code for converting 8-bit data into 16-bit data. Referring to FIG. 3, a serial/parallel converter 311 receives the serial data reproduced by a serial clock S_CLK and converts data received by a parallel clock P_CLK into the 8-bit parallel data. A memory controller 311 receives the 8-bit parallel data generated from the serial/parallel converter 311, re-arranges the 8-bit parallel data to 16-bit parallel data, and generates a memory read enable signal synchronized with the 16-bit parallel data. A ROM (Read Only Memory) 313 includes a demodulation data table and receives the 16-bit data generated from the memory controller 312 as an address. In this case, since $2^8$ code words among $2^{16}$ code words are used, $2^8$ correct conversion data is stored in the demodulation data table of the ROM 313, and "00" or "FF" is stored in the remaining regions of the demodulation data table. The ROM 313 receives the 16-bit data generated from the memory controller 312 as the address and is activated when the memory read enable signal is generated from the memory controller 312, thereby reading data stored in a corresponding address. A latch 314 latches demodulation data generated from the ROM 313 by the parallel clock P_CLK and supplies the latched demodulation data to the synchronous detector 116. Therefore, the demodulator 114 demodulates 16-bit modulation data reproduced from the recording medium to the original 8-bit data.

The synchronous detector 116 detects synchronizing data of the demodulation data generated from the demodulator 114 and generates the detected synchronizing data. The C2 decoder 117 corrects a general error from the detected synchronizing data. If the C2 decoder cannot, and therefore, does not correct the general error in the detected synchronizing data, the C2 decoder 117 generates a corresponding erasure error and an error flag. The C1 decoder 118 receives an output of the C2 decoder 117 and generates final corrected data by correcting both general errors and erasure errors. The C2 decoder 117 and the C1 decoder 118 may use AHA4310, AHA4510, AHA4810 or AHA4010 devices, which are Reed-Solomon ECC coprocessor ICs, manufactured by Advanced Hardware Architectures Co.

In operation, data which is converted into a digital form and then recorded/reproduced or transmitted may have some type of error by external influence during its processing. To correct the error data of the received data, an error correcting code (ECC) is generally used. A "general error" means error data without any error flag provided, thereby making it not possible to determine its error position. An "erasure error" means error data of which error position can be determined by its associated error flag. It is assumed that a C1 code and a C2 code are used as the error correcting codes. The error correcting codes currently used in most digital recording/reproducing apparatuses are Reed-Solomon codes. In the digital processing system using the Reed-Solomon codes, an error correcting function is carried out by a unit of a block code as shown in FIG. 4. That is, when decoding the demodulation data by the unit of a block code, the C2 decoder 117 corrects the error data of received data by the row unit of a block code. The C1 decoder 118 corrects the error data of received data by the column unit of a block code. Namely, when correcting the error data, received data and the C2 code are analyzed by the row unit, and then the received data and C1 code are analyzed by the column unit.

Data is converted into source data according to the channel in the demodulator 114. The converted data stream is supplied to the C2 decoder 117 to correct a general error generated at the interior of the data stream. The C2 decoder 117 corrects the error by carrying out a decoding operation. If there is no general error within one code or if there is a general error which can be corrected, the C2 decoder 117 corrects the general error and generates error corrected data. If there is a general error which can not be corrected, the C2 decoder 117 supplies the error flag to the C1 decoder 118 together with the original data. The C1 decoder 118 performs the decoding operation on the original data with the general error and the erasure error by using the original data and the error flag generated from the C2 decoder 117. Generally, the Reed-Solomon code can correct the general error by ½ of additional information and correct the erasure error by the length of the additional information.

Typically, the type of error generated when the digital data is transmitted or recorded/reproduced has two types. One is a random error and the other is a burst error generating errors successively. To effectively correct these errors, a block code or a product code is used. In the above examples, it is assumed that the C1 code or the C2 code is used. The conventional error correcting apparatus of FIG. 2 corrects the general error in the C2 code of the block code shown in FIG. 4 and corrects the general error and the erasure error in the C1 code. When there is error data among data reproduced from the demodulator 114, if there is no conversion data corresponding to the data having the error in the demodulation data table of the ROM 313, "00" or "FF" is generated. However, the error flag indicating that there is error data is not generated from the demodulator 114. Therefore, the C2 decoder 17 does not receive the error flag from the demodulator 114, and thus it can not correct the erasure error. As noted above, the Reed-Solomon code corrects the general error by ½ of the additional information and corrects the erasure error by the length of the additional information. The additional information of the C2 code is 10 bytes and that of the C1 code is 16 bytes as indicated in FIG. 4. Therefore, if the C2 decoder 117 corrects only the general error and the C1 decoder 118 corrects the general error and the erasure error, the amount of errors per block which can be corrected is C2=5×208=1040 bytes and C1=16×172= 2752 bytes. However, the C2 decoder 117 and the C1 decoder 118 can correct both the general error and the erasure error. In the conventional error correcting apparatus, the burst error is corrected in the second code. If the erasure error can be corrected even in the first code, the error correcting capability will be greatly improved.

SUMMARY OF THE INVENTION

It is an object of the invention to provide an apparatus and method which can raise error correcting efficiency by correcting a general error and an erasure error in both codes in a digital processing system using two error correcting codes.

In accordance with one aspect of the invention, an error correcting apparatus of a digital processing system includes a demodulator for demodulating channel data to source data and generating an error flag when error data occurs during demodulation, a synchronous detector for receiving the error flag and demodulation data generated from the demodulator and detecting a synchronizing signal to distinguish data by a unit of code which can correct the error data, a first decoder for decoding the demodulation data and the error flag by a unit of row by the synchronizing signal to correct a general error and an erasure error, and a second decoder for decoding the demodulation data and the error flag by a unit of column by the synchronizing signal to correct a general error and an erasure error.

The present invention will be more specifically described with reference to the attached drawings.

DETAILED DESCRIPTION OF THE PREFERRED EMBODIMENT

Figure 1:
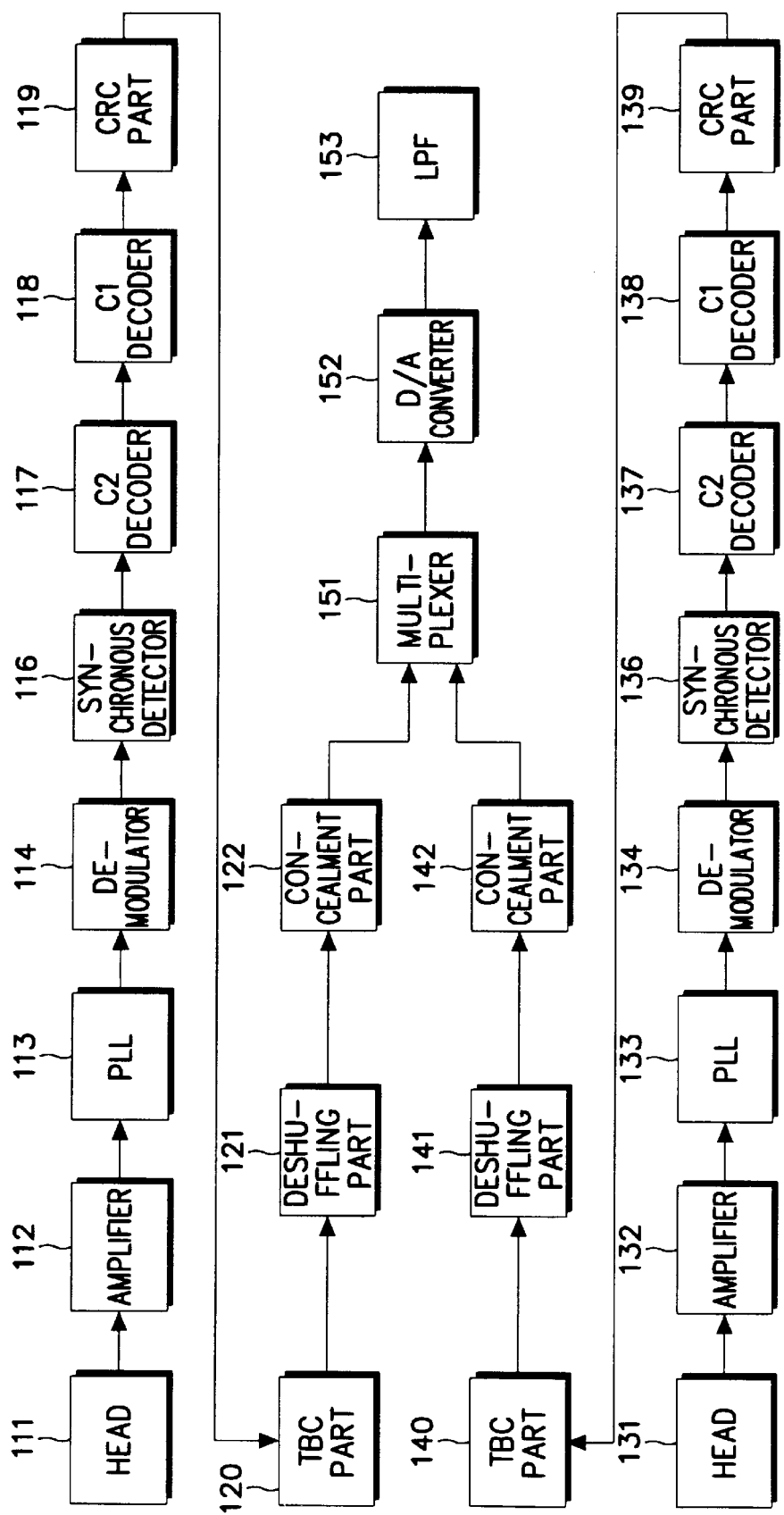
FIG. 1 is a block diagram illustrating a signal processing flow of a conventional digital recording/reproducing system.
Figure 2:
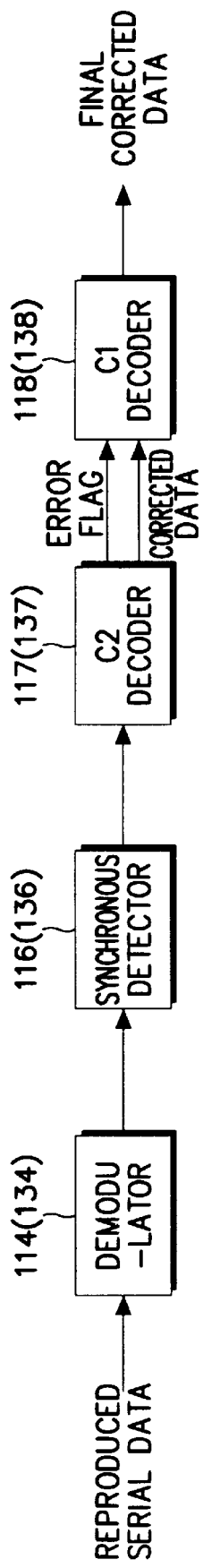
FIG. 2 is a block diagram illustrating a conventional error correcting apparatus in FIG. 1.
Figure 3:
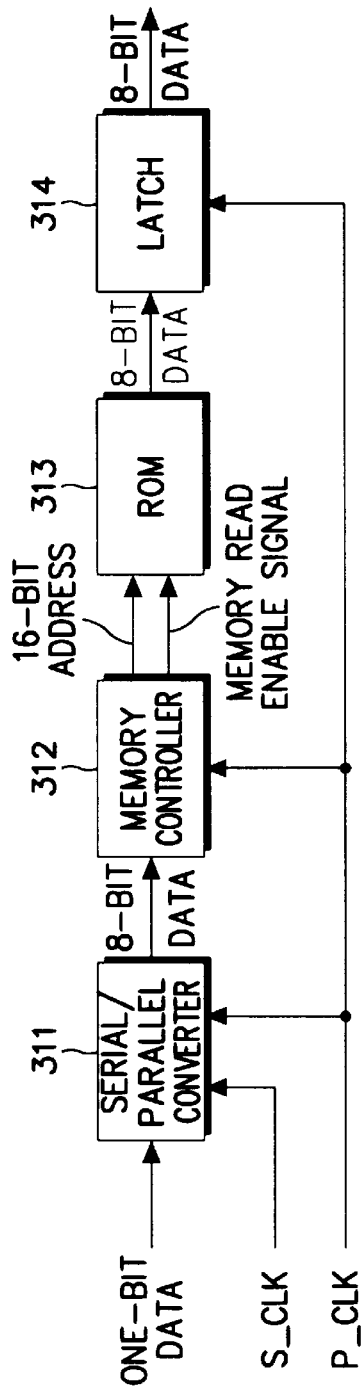
FIG. 3 is a block diagram illustrating a demodulator shown in FIG. 2.
Figure 5:
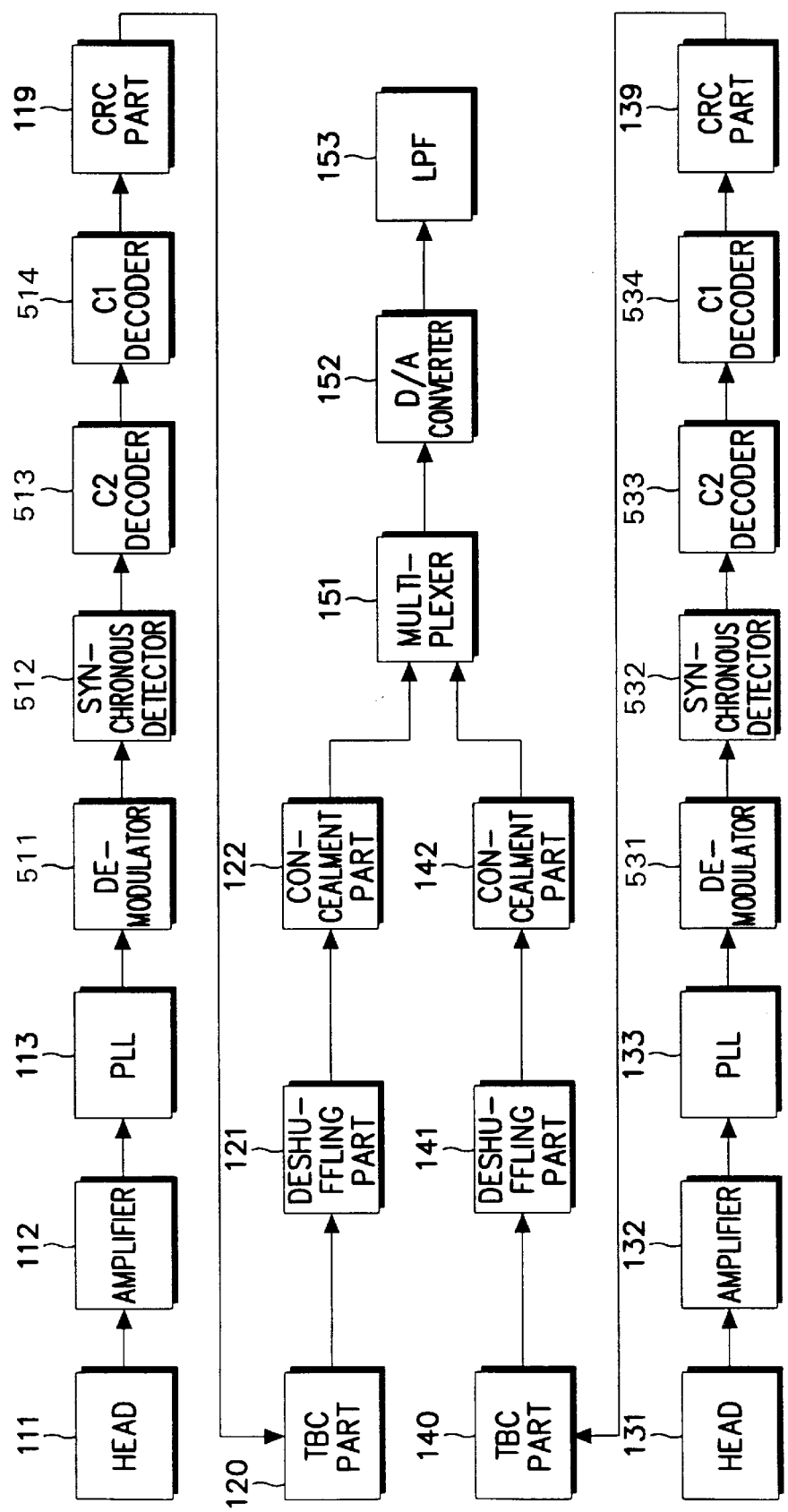
FIG. 5 is a block diagram illustrating a signal processing flow of a digital recording/reproducing system according to an embodiment of the present invention.

FIG. 5 illustrates a diagram of a signal processing flow of a digital recording/reproducing system according to an embodiment of the present invention. The elements in FIG. 5 having the same reference numerals as those in FIG. 1 perform similar functions. The digital recording/reproducing system shown in FIG. 5 differs from that shown in FIG. 1 by having demodulators 511 and 531, synchronous detectors 512 and 532, C2 decoders 513 and 533, and C1 decoders 514 and 534, instead of demodulators 114 and 134, synchronous detectors 116 and 136, C2 decoders 117 and 137, and C1 decoders 118 and 138.

Figure 6:
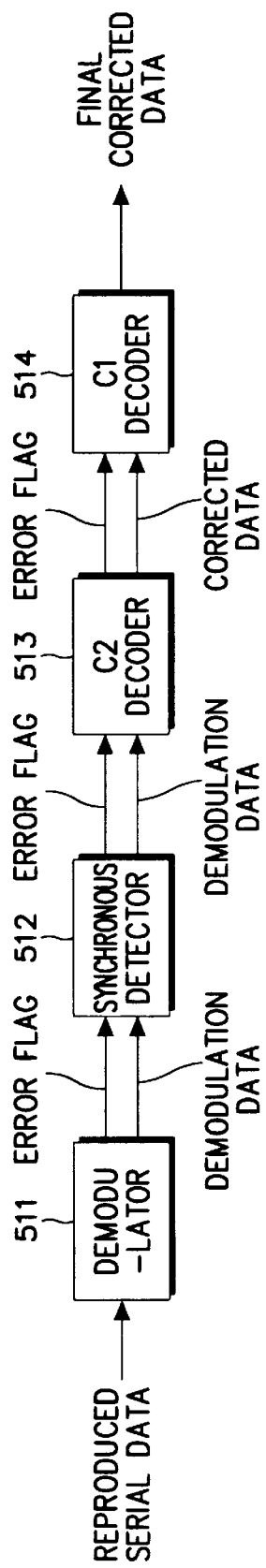
FIG. 6 is a block diagram illustrating an error correcting apparatus according to the embodiment the present invention.

FIG. 6 illustrates an error correcting apparatus of a digital processing system shown in FIG. 5. The demodulator 511, synchronous detector 512, C2 decoder 513, and C1 decoder 514 of the error correcting apparatus shown in FIG. 6 are positioned on a path of a channel A, and perform the same functions as the demodulator 531, synchronous detector 532, C2 decoder 533, and C1 decoder 534, respectively, positioned on a path of a channel B.

Figure 7:
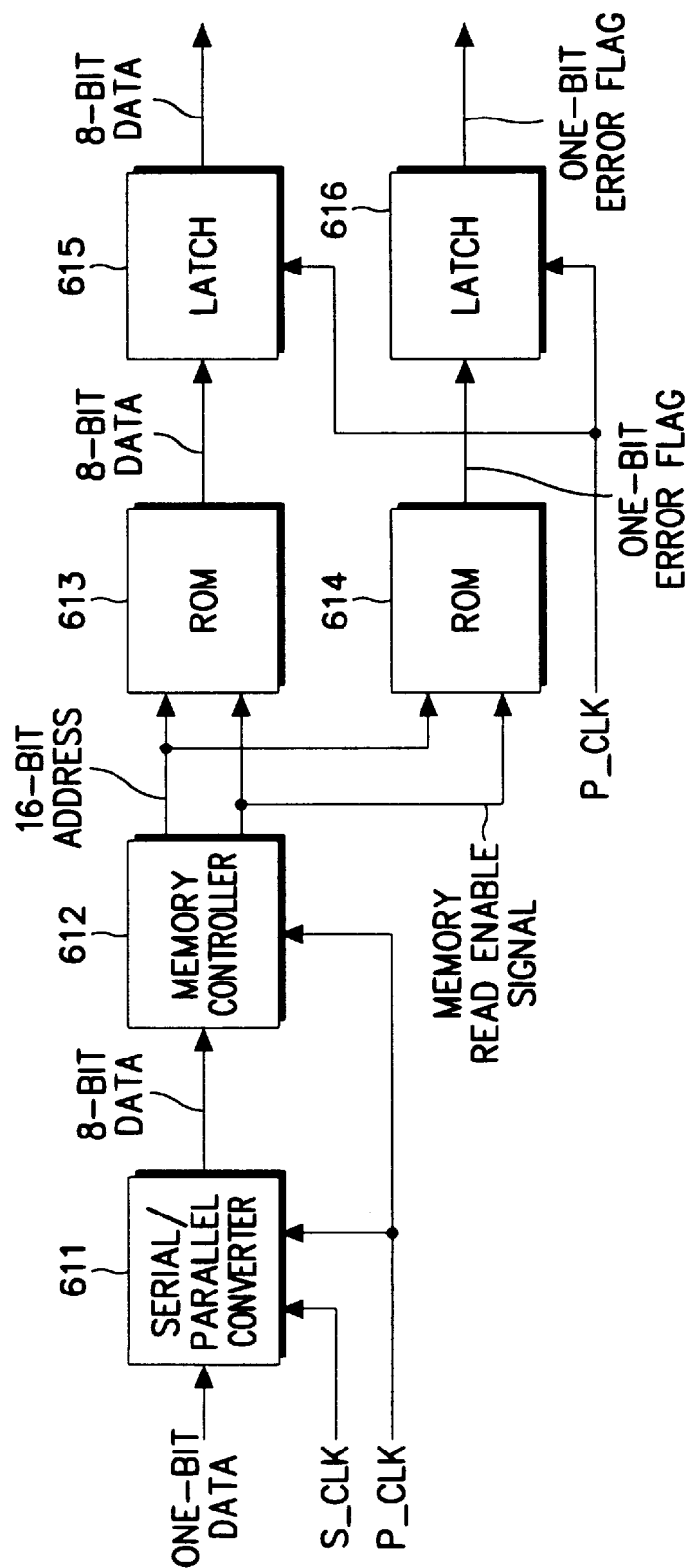
FIG. 7 is a block diagram illustrating a demodulator shown in FIG. 6.

Referring to FIG. 6, the demodulator 511 converts serial data generated from a PLL 113 of a corresponding channel into parallel data and demodulates modulated data to original data. The demodulator 511 also discriminates whether there is an error in data generated when reproduced, and generates an error flag when there is an error. Therefore, the demodulator 511 generates 8-bit demodulation data and the error flag. The demodulator 511 is constructed as shown in FIG. 7. It is assumed that a modulation code of data recorded in a recording medium is an eight-to-sixteen modulation plus code for converting 8-bit data into 16-bit data. Referring to FIG. 7, a serial/parallel converter 611 receives serial data reproduced by a serial clock S_CLK and converts data received by a parallel clock P_CLK into 8-bit parallel data. A memory controller 612 receives the 8-bit parallel data generated from the serial/parallel converter 611 by the parallel clock P_CLK, re-arranges the 8-bit parallel data to 16-bit parallel data, and generates a memory read enable signal synchronized with the 16-bit parallel data. A ROM 613 includes a demodulation data table and receives the 16-bit data generated from the memory controller 612 as an address. In this case, since $2^8$ code words among $2^{16}$ code words are used, $2^8$ correct conversion data is stored in the demodulation data table of the ROM 613, and "00" or "FF" is stored in the remaining regions of the demodulation data table. Therefore, the ROM 613 receives the 16-bit data generated from the memory controller 612 as the address and is activated when the memory read enable signal is generated from the memory controller 612, thus reading data stored in a corresponding address.

The modulated 16-bit data generated from the memory controller 612 is input as the address to the ROM 613 of the demodulator 511 and then the stored demodulated data is output therefrom. At this time, in case the modulated data is abnormal, wherein the modulated data designates a non-use region of the ROM 613 (region of the ROM 613 except for the demodulation data table), an error flag is generated by a ROM 614, such that the demodulator 511 outputs an erasure error. However, in case the modulated data is normal, the modulated data is an address of the demodulation data table, the error flag value has a particular value. Thus, in case the modulated data of the non-use region is input to the ROM 613, the error flag is generated.

In the case that the modulated 16-bit data is abnormal, but the abnormal modulated data has an address of the demodulation data table, the ROM 614 does not generate an error flag. That is, even though the modulated data is abnormal, an erasure error cannot be output, and the demodulator 511 outputs a general error to be corrected subsequently by the C2 or C1 decoder.

A latch 615 latches demodulation data generated from the ROM 613 by the parallel clock P_CLK and supplies the latched demodulation data to a synchronous detector 512. The ROM 614 includes a demodulation error flag table. The demodulation error flag table stores "0" in 28 code word regions, and "1" is stored in other regions. If the error flag is "1", the current data indicates an error state. If the error flag is "0", the current data indicates a normal state. The ROM 614 receives the 16-bit data generated from the memory controller 612 as the address and generates the error flag of the corresponding address when the memory read enable signal is generated from the memory controller 612. A latch 616 supplies the error flag generated from the ROM 614 to the synchronous detector 512. In case there occurs any error data except for those $2^8$ number of codewords actually used in the disclosed embodiment of the maximum $2^{16}$ number of combinations of codewords, the demodulator 511 provides 8-bit data "00" or "FF" in hexadecimal together with a 1-bit error flag in the data bus. Therefore, the demodulator 511 demodulates 16-bit modulation data reproduced from the recording medium into the 8-bit original data and simultaneously generates corresponding data and the error flag when error data occurs.

The synchronous detector 512 detects synchronizing data of the demodulation data generated from the demodulator 511 and generates the error flag together with the detected synchronizing data. The C2 decoder 513 corrects general errors and erasure errors by checking the detected synchronizing data and the error flag and generates corresponding data which does not correct the error and the error flag. A C1 decoder 514 receives an output of the C2 decoder 513 and generates final corrected data by correcting the general errors and erasure errors. Each decoder has its own capacity of error correction. Thus, the C2 decoder deals with the general error and the erasure error correction within its own error correction capacity, and then, the C1 decoder deals with those general errors and erasure errors exceeding the capacity of the C2 decoder which are not corrected by the C2 decoder. The C2 decoder 513 and the C1 decoder 514 may use AHA4310, AHA4510, AHA4810 or AHA4010 devices, which are Reed-Solomon ECC coprocessor ICs, manufactured by Advanced Hardware Architectures Co.

In operation, the demodulator 511 receives the reproduced serial data and converts the serial data into the parallel data, as shown in FIG. 7. The reproduced serial data is 16-bit modulation data. The serial/parallel converter 611 converts the 16-bit modulation data into 8-bit parallel data. The memory controller 612 re-arranges the 8-bit parallel data to the 16-bit parallel data. The ROM 613 has the demodulation data table and reads the 8-bit demodulation data stored in a position designated by the memory controller 612. The ROM 614 includes the error flag table and reads the 1-bit error flag stored in a position designated by the memory controller 612. Therefore, the demodulator 511 demodulates the 16-bit modulation data to the 8-bit data. If error data occurs, the demodulator 511 sets the error flag. A channel code used in the preferred embodiment of the present invention is the eight-to-sixteen plus code and has a fixed length changed to 16-bit channel data from 8-bit data. That is, only $2^8$ codes among $2^{16}$ codes are transmitted or recorded/reproduced. If error data occurs among the reproduced data and thus one code is changed to another code, whether the error data occurs can not be judged. However, if one code is changed to an unused code, an occurrence of the error is judged. Therefore, the ROM 614 for storing the error flag table is interlocked with the ROM 613 to perform an access operation. If the unused code is designated, the error flag is set.

Figure 4:
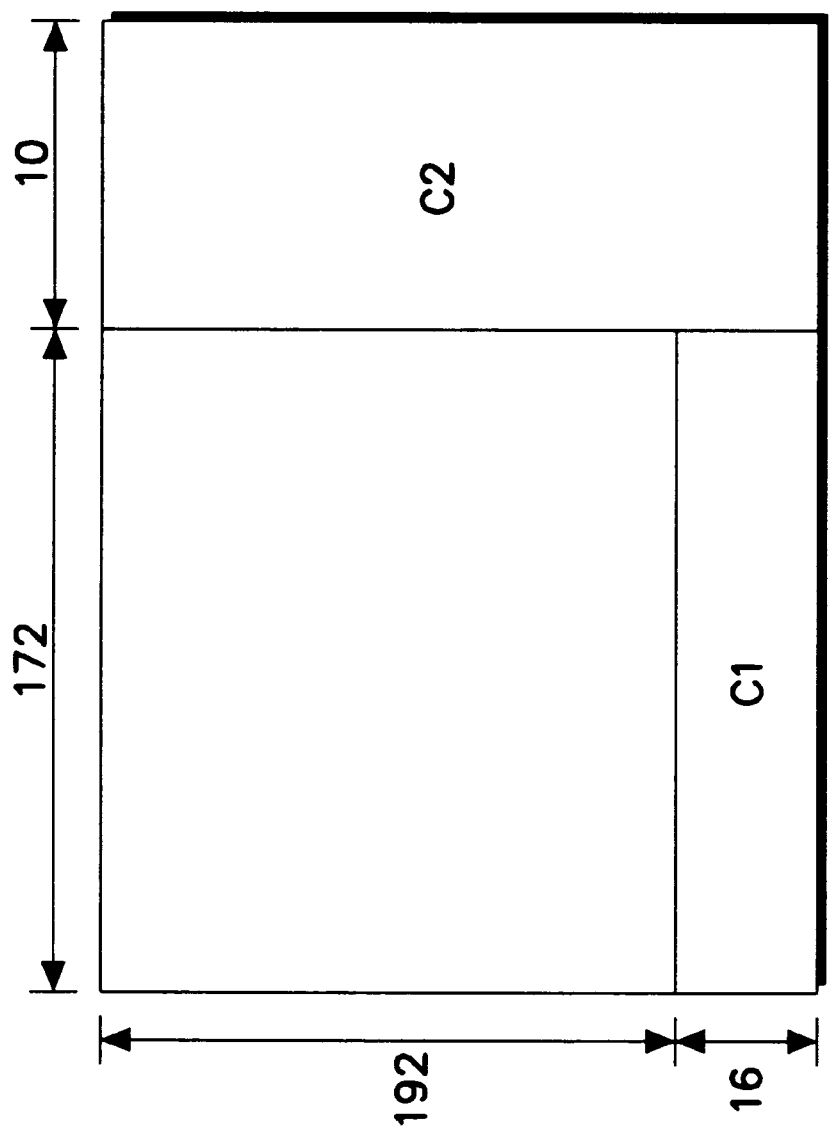
FIG. 4 is a diagram illustrating a construction of a block code used in the digital recording/reproducing system of FIG. 1.

The 8-bit parallel data and one-bit error flag generated from the demodulator 511 are supplied to the synchronous detector 512. The synchronous detector 512 detects the synchronizing signal from the transmitted or reproduced data stream and generates the detected synchronizing signal for distinguishing data by a unit of code which can correct the general error and the erasure error by the C2 decoder 513. The synchronous detector 512 supplies the data and the error flag to the C2 decoder 513 together with the detected synchronizing signal. The C2 decoder 513 corrects the general error and the erasure error by using the data and the detected synchronizing signal generated from the synchronous detector 512. In the block code shown in FIG. 4, since there is addition information of 10 bytes in the direction of row, the C2 decoder 513 can correct 5 general errors and 10 erasure errors. That is, since the demodulator 511 generates the demodulation data and the error flag, the C2 decoder 513 can simultaneously correct the general error and the erasure error. Since the additional information is 10 bytes in the direction of row, the C2 decoder 513 can correct a maximum of 10 erasure errors. If there is a general error or an erasure error which can not be corrected by the C2 decoder 513, the C2 decoder 513 supplies corresponding data and the error flag to the C1 decoder 514. The C1 decoder 514 finally corrects the error data, whether the same is a general error or an erasure error. In the block code shown in FIG. 4, since the additional information of 16 bytes is positioned in the direction of column, the C1 decoder 514 can correct 16 erasure errors.

Consequently, in the digital processing system having two decoders for carrying out the error correcting function, since the respective decoders can correct both the general error and the erasure error, the error correcting function is improved. When correcting the erasure errors of the block code shown in FIG. 4, the C2 decoder 513 can correct the erasure errors of C2=10×208=2080 bytes and the C1 decoder 514 can correct the erasure errors of C1=16×172=2752 bytes.

Although the digital processing system having two decoders has been shown and described, the above principle may be applied to the system having three decoders or more.

As noted previously, the digital processing system including two decoders can increase the number of errors which can be corrected in the C2 code. In such a case, arithmetically there is twice an error correcting effect, but the burden of correcting the general errors and erasure errors in the C1 code can be relatively reduced since many of the general errors and erasure errors are corrected in the C2 code. Therefore, a probability that error data which can not be corrected is generated is greatly reduced.

What is claimed is:

1. An error correcting apparatus of a digital processing system to correct errors in channel data, comprising:

a demodulator to demodulate said channel data to demodulation data and generating error flags based upon the errors occurs during the demodulation;

a synchronous detector to receive said error flags and demodulation data generated from said demodulator, and to detect a synchronizing signal of said demodulation data to distinguish data by a unit of code capable of correcting the errors;

a first decoder to decode said demodulation data and said error flags by a unit of row by said synchronizing signal, and to correct general errors and erasure errors of the errors of said demodulation data; and a second decoder to decode said demodulation data and said error flags by a unit of column by said synchronizing signal, and to correct other general errors and erasure errors of said demodulation data that said first decoder is unable to correct.

2. An error correcting apparatus of a digital processing system as claimed in claim 1, wherein said demodulator comprises:

a first memory having a demodulation data table to store said demodulation data; and a second memory having an error flag table to store said error flags;

wherein said demodulator generates said demodulation data and said error flags by receiving said channel data as eight-to-sixteen modulation data as addresses of said first and second memories.

3. An error correcting method of a digital processing system to correct errors in channel data, comprising the steps of:

demodulating said channel data to demodulation data and generating error flags each time one of the errors occurs during the demodulation;

receiving said error flags and demodulation data and detecting a synchronizing signal from said demodulation data to distinguish data by a unit of code capable of correcting the errors;

decoding said demodulation data and said error flags by a unit of row by said synchronizing signal, to correct general errors and erasure errors of the errors of said demodulation data; and decoding said demodulation data and said error flags by a unit of column by said synchronizing signal, to correct other general errors and erasure errors of said demodulation data that said decoding by the unit of row is unable to correct.

4. An error correcting method of a digital processing system as claimed in claim 3, wherein said demodulating step includes the steps of:

re-arranging eight-to-sixteen modulation data received by a unit of 8 bits to 16-bit data;

applying said re-arranged 16-bit data as an address of a demodulation data table of a first memory which stores said demodulation data, to generate said demodulation data; and applying said re-arranged 16-bit data as an address of an error flag table of a second memory which stores said error flags, to generate said error flags.

5. A digital processing system to correct errors in channel data, comprising:

a demodulator to demodulate said channel data to demodulation data and generating error flags based upon the errors;

a synchronous detector to receive said error flags and demodulation data, and to detect a synchronizing signal of said demodulation data to distinguishing data by a unit code capable of correcting the errors; and a decoding unit to decode said demodulation data, to correct general errors and erasure errors of the errors using a first error-correcting code and based upon said synchronizing signal, and to correct other general errors and erasure errors that are not corrected by said first error-correcting code using a second error-correcting code and based upon said synchronizing signal.

6. A digital processing system as claimed in claim 5, wherein said decoding unit comprises:

a first decoder to decode said demodulation data and said error flags by a unit of row by said synchronizing signal, and to correct the general errors and erasure errors of said demodulation data using said first error-correcting code; and a second decoder to decode said demodulation data and said error flags by a unit of column by said synchronizing signal, and to correct the other general errors and erasure errors of said demodulation data that said first decoder did not correct using said second error-correcting code.

7. A digital processing system as claimed in claim 6, wherein said demodulator comprises:

a first memory having a demodulation data table to store said demodulation data; and a second memory having an error flag table to store said error flags;

wherein said demodulator generates said demodulation data and said error flags by receiving said channel data as eight-to-sixteen modulation data as addresses of said first and second memories.

8. A digital signal processing system as claimed in claim 7, wherein said first and second codes are Reed-Solomon codes.

9. A digital processing system as claimed in claim 6, wherein said demodulator comprises:

a serial/parallel converter to convert said channel data from sixteen bit serial data to eight bit parallel data in accordance with a serial clock and a parallel clock;

a memory controller to generate sixteen bit parallel data of addresses from said eight bit parallel data in accordance with said parallel clock, and to generate a memory read enable signal synchronized with said sixteen bit parallel data of addresses;

a first memory which stores said demodulation data and outputs said demodulation data in accordance with said sixteen bit parallel data of addresses and said memory read enable signal; and a second memory which stores said error flags and outputs said error flags in accordance with said sixteen bit parallel data of addresses and said memory read enable signal.

10. A digital signal processing system as claimed in claim 9, wherein said demodulator further comprises:

a first latch to latch said demodulation data output from said first memory based upon said parallel clock; and a second latch to latch said error flags output from said second memory based upon said parallel clock.

11. A digital signal processing system as claimed in claim 9, wherein said first memory includes a demodulation data table to store said demodulation data and one of "00" and "FF" is stored on the remaining regions of said demodulation data table.

12. A digital signal processing system as claimed in claim 11, wherein said first and second codes are Reed-Solomon codes.

13. A digital signal processing system as claimed in claim 11, wherein said second memory includes a demodulation flag error table in which first regions of said demodulation flag error table have a first value indicating a normal state of said demodulation data and second regions of said demodulation flag error table have a second value different from said first value and indicating an error state of said demodulation data.

14. A digital signal processing system as claimed in claim 13, wherein said first memory stores said demodulation data as eight bit data.

15. A digital signal processing system as claimed in claim 14, wherein said first and second memories are read only memories.

16. A digital signal processing system as claimed in claim 9, wherein said second memory includes a demodulation flag error table in which first regions of said demodulation flag error table have a first value indicating a normal state of said demodulation data and second regions of said demodulation flag error table have a second value different from said first value and indicating an error state of said demodulation data.

17. A digital signal processing system as claimed in claim 9, wherein said first memory stores said demodulation data as eight bit data.

18. A digital signal processing system as claimed in claim 9, wherein said first and second memories are read only memories.

19. A digital processing system as claimed in claim 5, wherein said demodulator comprises:

a first memory having a demodulation data table and a non-use region other than said demodulation data table to store said demodulation data; and a second memory having an error flag table to store said error flags;

wherein said first memory outputs said demodulation data in accordance with said channel data, and said second memory outputs an error flag corresponding to said demodulation data in response to said channel data designating the non-use region of said first memory, such that said demodulator outputs one of said erasure errors.

20. A digital processing system as claimed in claim 19, wherein said second memory fails to output the error flag corresponding to said demodulation data in response to said channel data being abnormal and designating an address of said demodulation table, such that said demodulator outputs one of said general errors.

21. A digital processing system as claimed in claim 20, wherein said decoding unit comprises:

a first decoder to decode said demodulation data and said error flags by a unit of row by said synchronizing signal, and to correct the general errors and erasure errors of said demodulation data using said first error-correcting code; and a second decoder to decode said demodulation data and said error flags by a unit of column by said synchronizing signal, and to correct the other general errors and erasure errors of said demodulation data that said first decoder did not correct using said second error-correcting code.

22. A digital processing system as claimed in claim 5, wherein said demodulator comprises:

a serial/parallel converter to convert said channel data from sixteen bit serial data to eight bit parallel data in accordance with a serial clock and a parallel clock;

a memory controller to generate sixteen bit parallel data of addresses from said eight bit parallel data in accordance with said parallel clock, and to generate a memory read enable signal synchronized with said sixteen bit parallel data of addresses;

a first memory having a demodulation data table and a non-use region other than said demodulation data table, to store said demodulation data; and a second memory having an error flag table to store said error flags;

wherein said first memory outputs said demodulation data in accordance with said sixteen bit parallel data, and said second memory outputs an error flag corresponding to said demodulation data in response to said sixteen bit parallel data designating the non-use region of said first memory, such that said demodulator outputs one of said erasure errors.

23. A digital processing system as claimed in claim 22, wherein said second memory fails to output the error flag corresponding to said demodulation data in response to said sixteen bit parallel data being abnormal and designating an address of said demodulation table, such that said demodulator outputs one of said general errors.

* * * * *